(12) United States Patent
Passlack et al.

(10) Patent No.: US 10,991,576 B2
(45) Date of Patent: Apr. 27, 2021

(54) CRYSTALLINE SEMICONDUCTOR LAYER FORMED IN BEOL PROCESSES

(71) Applicant: Taiwan Semiconductor Manufacturing Co., Ltd., Hsinchu (TW)

(72) Inventors: Matthias Passlack, Huldenberg (BE); Blandine Duriez, Brussels (BE); Georgios Vellianitis, Heverlee (BE); Gerben Doornbos, Kessel-Lo (BE); Marcus Johannes Henricus Van Dal, Linden (BE); Martin Christopher Holland, Bertem (BE); Mauricio Manfrini, Leuven (BE)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 21 days.

(21) Appl. No.: 16/585,571

(22) Filed: Sep. 27, 2019

(65) Prior Publication Data
US 2020/0135930 A1 Apr. 30, 2020

Related U.S. Application Data

(60) Provisional application No. 62/753,744, filed on Oct. 31, 2018.

(51) Int. Cl.
*H01L 21/02* (2006.01)
*H01L 29/786* (2006.01)
*H01L 29/66* (2006.01)

(52) U.S. Cl.
CPC .. *H01L 21/02488* (2013.01); *H01L 21/02532* (2013.01); *H01L 21/02592* (2013.01); *H01L 21/02645* (2013.01); *H01L 21/02675* (2013.01); *H01L 29/66757* (2013.01); *H01L 29/78603* (2013.01); *H01L 29/78618* (2013.01); *H01L 29/78648* (2013.01); *H01L 29/78675* (2013.01); *H01L 29/78696* (2013.01)

(58) Field of Classification Search
CPC ......... H01L 29/78696; H01L 29/66757; H01L 29/78648; H01L 29/517; H01L 21/02645; H01L 21/02675; H01L 21/02592; H01L 21/02488; H01L 21/02175; H01L 21/823462; H01L 27/1274
See application file for complete search history.

(56) References Cited

U.S. PATENT DOCUMENTS

2019/0096919 A1* 3/2019 Matsukizono ...... H01L 27/1225
2020/0119085 A1* 4/2020 Chen ................. H01L 29/78693

* cited by examiner

*Primary Examiner* — Joseph C. Nicely
(74) *Attorney, Agent, or Firm* — Seed IP Law Group LLP

(57) ABSTRACT

A crystalline channel layer of a semiconductor material is formed in a backend process over a crystalline dielectric seed layer. A crystalline magnesium oxide MgO is formed over an amorphous inter-layer dielectric layer. The crystalline MgO provides physical link to the formation of a crystalline semiconductor layer thereover.

20 Claims, 10 Drawing Sheets

CRYSTALLINE SEMICONDUCTOR LAYER FORMED IN BEOL PROCESSES

BACKGROUND

Thin film transistor (TFT) devices are semiconductor devices typically formed employing a semiconductor channel layer and a pair of source/drain layers laminated over an insulator substrate rather than formed within a semiconductor substrate. TFT devices are extensively employed as switching devices and peripheral circuit devices within organic LED optoelectronic products. TFT devices are also employed as load transistors within synchronous dynamic random access memory (SDRAM) products. While TFT devices are thus common in the microelectronic product fabrication art, thin film transistor devices are nonetheless not entirely without problems. In that regard, insofar as TFT devices are formed employing a semiconductor channel layer and a pair of source/drain layers positioned over an insulator substrate, rather than formed within a semiconductor substrate, TFT devices are thus often difficult to form with both enhanced performance and enhanced alignment.

Semiconductor fabrication processes are generally categorized into front-end-of-line (FEOL), middle-of-line, (MOL), and back-end-of-line (BEOL). The FEOL processes include wafer preparation, isolation, well formation, gate patterning, spacer, extension and source/drain implantation, silicide formation, and dual stress liner formation. The MOL processes includes gate contact and/or source/drain contact formation. The BEOL processes include all wafer fabrication processes subsequent to the MOL or FEOL, for example, forming the wirings in metallization layers to interconnect the individual devices. The metallization layers are separated by dielectric layers, namely, the inter-layer dielectric (ILD) layers. The ILD layers are either silicon oxide or low-k dielectric materials.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1A:
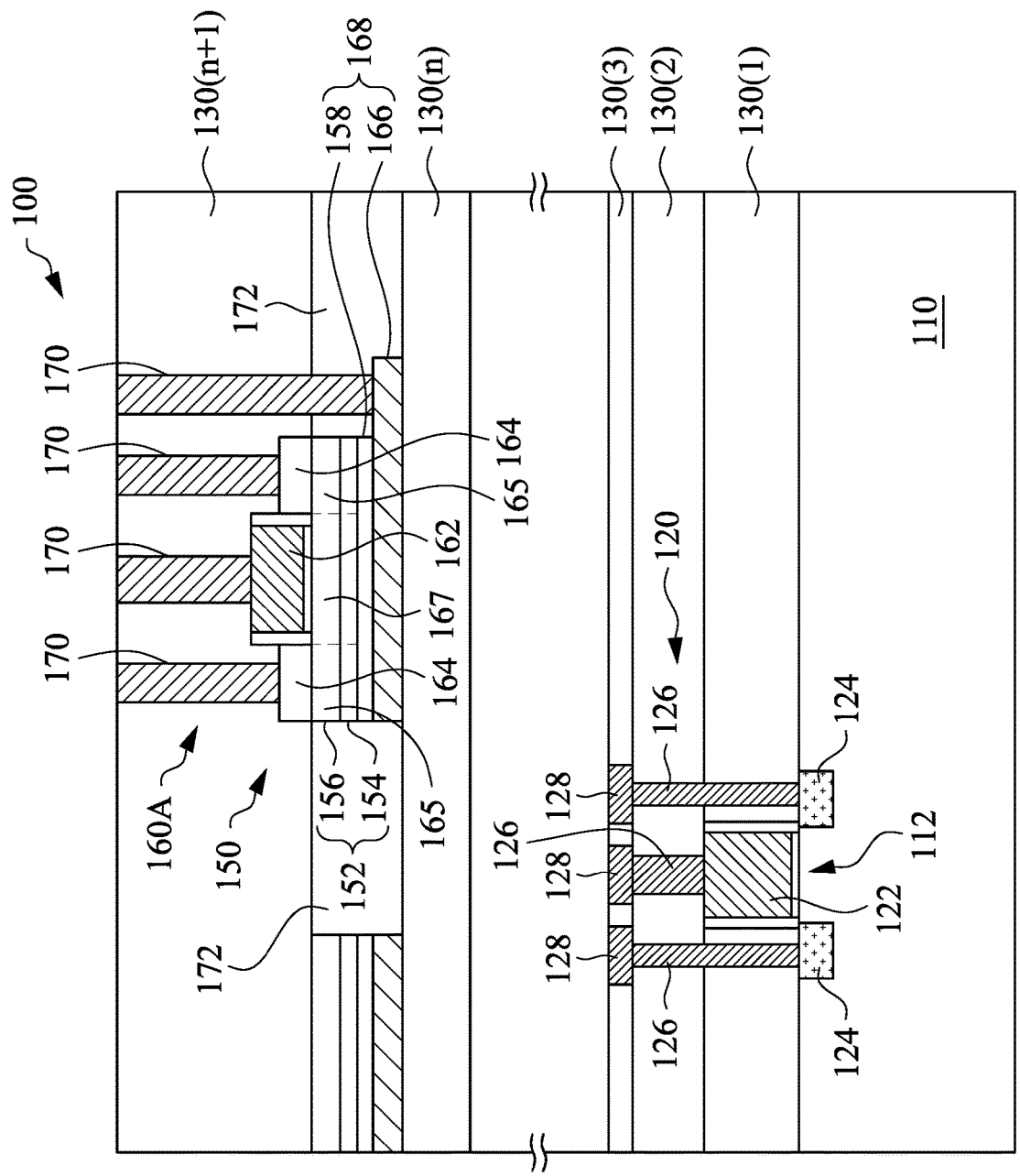
FIGS. 1A-1C are example structures, according to example embodiments of the disclosure.

The current techniques are directed to forming semiconductor devices in a back-end-of-line (BEOL) process and the related semiconductor devices. Inventors observed that various application scenarios require integration of devices formed in the BEOL processes into devices formed in the front-end-of-line (FEOL) processes. For example, thin-film transistors (TFT) formed in BEOL process may be used to increase device density of the integrated circuits (IC), to provide high precession/low noise resistors and/or in display and image devices like LED, LCD or CCD. Micro-electromechanical systems (MEMS) like MEMS accelerometers, MEMS gyroscopes, MEMS microphones, resonators are also suitable for BEOL processes. Non-volatile memories may also be formed under BEOL processes. One clear advantage of integrating BEOL devices with FEOL devices is the improved three-dimensional density of the integrated circuits. Further, with proximity to metallization layers from both upper side and lower side, the BEOL devices may have advantages in signal/noise management and timing/delay configurations.

However, as the inventors observed, forming a semiconductor device in the BEOL processes is challenging because it is difficult to form a crystalline semiconductor layer over an amorphous dielectric layer, e.g., an oxide layer. For example, silicon (Si), germanium (Ge) or silicon germanium (SiGe) can be grown on silicon oxide in amorphous form through deposition techniques like MOVCD or MBE. But the amorphous Si, Ge or SiGe cannot be grown as a single crystal because the underlying silicon oxide (or a low-k dielectric layer) does not provide a crystalline lattice link to seed the growth of crystal structure. Further, a high temperature annealing procedure, e.g., higher than 500° C. for crystalizing Si, is generally not suitable for a back-end process.

In the disclosed techniques, a crystalline channel layer of a semiconductor material (e.g., silicon, germanium, or silicon germanium) is formed in a backend process over a crystalline dielectric seed layer. Specifically, a crystalline dielectric seed layer, e.g., crystalline magnesium oxide (MgO), is formed over an amorphous inter-layer dielectric layer, e.g., of silicon oxide. Other seed layer materials are also possible, which preferably have the properties of being formed with a crystalline structure under a relatively low processing temperature, e.g., lower than 500° C. MgO is a suitable material for the seed layer, which can be directly deposited with a crystalline structure or be crystallized with a low anneal temperature of between about 100° C. to about 400° C. In an embodiment, the MgO seed layer is formed with a thickness of about 2 nm or other suitable thickness values depending on device configurations. A thin layer, e.g., about 2 nm thickness or other suitable thickness values, of amorphous semiconductor material, e.g., silicon, is deposited over the crystalline MgO seed layer under a suitable deposition process, e.g., PVD or ALD. The thin layer of amorphous silicon is crystallized through a nanosecond (ns) laser anneal process with a temperature of about 1000° C. The ns laser anneal process helps to keep the heating effects local without damaging the surrounding or underlying features. The resultant thin layer of crystalline silicon may serve as a base layer, also referred to as "lower semiconductor layer," for further formation of crystalline semiconductor layer(s) thereupon. A crystalline semiconductor layer, also referred to as "upper semiconductor layer," is then formed over the base layer of crystalline silicon. For example, an amorphous semiconductor layer, e.g., silicon, germanium or silicon germanium, is deposited over the base/lower semiconductor layer. The amorphous elemental semiconductor layer is crystallized through an ns laser anneal process to form the crystalline upper semiconductor layer. The crystalline upper semiconductor layer has a thickness of about 10 nm, e.g., between about 8 nm to about 30 nm. In another example, a compound semiconductor layer, e.g., GaN or InN, may be formed over the crystalline base silicon layer. The upper compound semiconductor layer may be formed directly with a crystalline structure using epitaxial techniques like CVD, MOCVD and may be annealed to enhance the crystallinity.

The one or more of the upper or lower semiconductor layers are then patterned to form a semiconductor region of an active device, e.g., a thin film transistor (TFT). For example, a gate structure and source/drain structures may be formed adjacent to the semiconductor region to form a field-effect transistor (FET).

In an alternative or additional example, a metal layer of backend suitable metal materials, e.g., Cu, Co, W, Ru, is formed between the crystalline MgO seed layer and the amorphous inter-layer dielectric layer of, e.g., silicon oxide. The metal layer enhances the crystallinity of the MgO seed layer. For example, an MgO layer may be formed with a crystalline structure over the metal layer without an annealing process. A semiconductor region is formed over the MgO seed layer. In an embodiment, the metal layer may be patterned to form a gate structure below the channel region, while the MgO seed layer is patterned to form a high-k gate dielectric layer.

In a further example, a double gate device may include a back gate under a semiconductor region and a front gate over the semiconductor region. A double gate configuration may provide better gate control of the carrier density in the semiconductor channel region.

A resultant device includes a substrate, e.g., a silicon substrate, an amorphous dielectric layer over the substrate, a crystalline dielectric layer, e.g., MgO, over the amorphous dielectric layer, and a device that has a crystalline semiconductor region over the crystalline MgO layer. The crystalline semiconductor region of the device is one or more of a crystalline elemental semiconductor material(s) or a crystalline compound semiconductor material(s). The device also includes a pair of source/drain regions one or more of embedded within or over the semiconductor body. A gate structure of the device is positioned one or more of over the semiconductor region or below the MgO layer.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1A shows an example structure 100. Referring to FIG. 1A, the structure 100 includes a substrate 110, e.g., a silicon substrate, a FEOL device 120 formed over the substrate 110 and a BEOL device 150 formed over the FEOL device 120, and specifically over inter-layer dielectric layer 130(*n*) that is formed over the FEOL device 120. The FEOL device 120 may be any device that is formed on or over the substrate 110 through the FEOL processes, like a transistor, a capacitor, a resistor, etc., which are all included in the disclosure. For example, the FEOL device 120 includes a transistor having a gate structure 122, and a pair of source/drain structures 124. A semiconductor region 112, e.g., a channel 112, of the FEOL device 120 is embedded in or formed directly over the silicon substrate 110. For example, the semiconductor region 112 is a fin type structure extending upward from the substrate 110. In some embodiments, the semiconductor region 112 includes a plurality of semiconductor strips that are separated from one another. The gate structure 122 may include a gate electrode and a gate dielectric and may contact the semiconductor region 112 from at least one side of the semiconductor region 112. In some embodiment, the gate structure 122 contacts three or more sides of the semiconductor region 112 and thus wraps around the semiconductor region 112 or one or more of the semiconductor strips of the semiconductor region 112. The source/drain structures 124 are each one or more of embedded in the substrate 110 or positioned over the substrate 110 and are formed through one or more of doping or epitaxy growth over the substrate 110. The FEOL device 120 is coupled to wirings 128 (or metallization layer 128) through interconnect structures 126. For simplicity purposes, FIG. 1A shows that the gate structure 122 and both source/drain regions 124 are all coupled to wirings 128 arranged in a same level of dielectric layer, e.g., dielectric layer 130(3), which does not limit the scope of the disclosure. The gate structure 122 and the source/drain regions 124 of the FEOL device 120 may be coupled to wirings 128 arranged in different metallization levels.

The FEOL device 120, the interconnect structures 126 and the metallization layer 128 are each adjacent to dielectric layers 130(1), 130(2), 130(3). Generally, the dielectric layer 130(1) that is adjacent to or at the same level with the FEOL device 120 is called the first interlayer dielectric (ILD) layer. The other dielectric layers are ILD layers positioned above the first ILD layer 130(1). For example, the ILD layer 130(2) adjacent to the interconnect structures 126 is one level above the first ILD layer 130(1) and is called the second ILD layer 130(2) for descriptive purposes. The forming of the interconnect structure 126 within the second ILD layer 130(2) is sometimes called the MOL process, although it is also equally common that MOL and BEOL processes are not differentiated and are referred to together as BEOL processes that indicate everything formed after the first ILD 130(1). In the disclosure herein, for descriptive purposes, the term BEOL is used to refer to any layers formed after the first ILD 130(1) and include both the BEOL or the MOL processes.

The BEOL device 150 is positioned over an interlayer dielectric layer 130(n). The ILD 130(n) may be any ILD layer, but normally the ILD layer 130(n) is above the first ILD layer 130(1). That is, in an embodiment, n>1. In an embodiment, the ILD layer 130(n) is positioned above the second ILD layer 130(2), i.e., n>2. In the disclosure herein, BEOL device is used to refer to the device 150 for descriptive purposes. However, it should be appreciated that the BEOL device 150 may be formed over any ILD layer 130, including the first ILD layer 130(1), which does not deviate from the disclosure. Further, the description of the BEOL device 150 may also apply to a device formed in a dielectric substrate, which is also included in the disclosure.

The ILD layer 130(n) is silicon oxide or a low-k dielectric material or other suitable dielectric materials and has an amorphous structure. For example, the ILD 130(n) is one or more of silicon oxide ($SiO_2$), silicon oxynitride, silicon nitride ($Si3N4$), silicon monoxide (SiO), silicon oxynitrocarbide (SiONC), silicon oxycarbide (SiOC), silicon mononitride (SiN), or other dielectrics materials.

The BEOL device 150 includes a crystalline semiconductor layer 152 positioned above the ILD layer 130(n). In an embodiment, the crystalline semiconductor layer 152 may include a base or lower semiconductor layer 154 and an upper semiconductor layer 156 that is formed over the base semiconductor layer 154. In an embodiment, the base semiconductor layer 154 is crystalline silicon and the upper semiconductor layer 156 is one or more of crystalline silicon, crystalline germanium, crystalline silicon germanium or a crystalline compound semiconductor material. That is, the base semiconductor layer 154 and the upper semiconductor layer 156 may include different semiconductor materials. In an embodiment, the base semiconductor layer 154 has a thickness ranging between about 1 nm to about 4 nm. In an embodiment, the base semiconductor layer is about 2 nm. In an embodiment, the upper semiconductor layer 156 has a thickness ranging between about 6 nm to about 14 nm. In an embodiment, the upper semiconductor layer 156 is about 10 nm. In an embodiment, the upper semiconductor layer 156 is intrinsic or doped with dopant atoms such as B, Ga, As, or P at concentrations ranging between $10^{17}$ and $10^{19}$ atoms per $cm^3$.

The crystalline semiconductor layer 152 is positioned over a seed layer 158. The seed layer 158 is a crystalline dielectric layer and provides, among others, the physical crystalline lattice link for the formation of the crystalline semiconductor layer 152. As the seed layer 158 is formed over the ILD layer 130(n) in the BEOL processes (MOL processes included), the crystalline seed layer 158 preferably is formed with low process temperature. A low temperature is referred to with respect to the specific materials of the ILD layer 130(n) and the features formed within or adjacent to the ILD layers 130(n) and the ILD layers therebelow. Generally, a temperature of 500° C. or below is considered a low temperature for forming the seed layer 158.

In an embodiment, the seed layer 158 is magnesium oxide (MgO) in crystalline form. A thickness of the MgO seed layer 158 ranges from about 1 nm to about 4 nm. In an embodiment, the MgO layer 158 is about 2 nm.

An example TFT transistor 160A is formed having the semiconductor layer 152 as the semiconductor body, e.g., a channel layer. The TFT transistor 160A includes a first gate structure 162 positioned at least partially over the semiconductor layer 152. In an embodiment, the first gate structure 162 is adjacent to three or more sides of the semiconductor layer 152. In some embodiments, the semiconductor layer 152 includes a plurality of separate semiconductor strips vertically stacked over one another and the first gate structure wraps around one or more of the semiconductor strips of the semiconductor layer 152. The TFT transistor 160A also includes a pair of source/drain structures 164. The source/drain structures 164 include semiconductor materials and are each positioned in connection with the semiconductor layer 152. For example, the source/drain structure 164 is one or more of embedded in or positioned over the semiconductor layer 152. The source/drain structure 164 may include a same or a different semiconductor material from that of the semiconductor layer 152.

In an embodiment, a metal layer 166 is positioned between the seed layer 158 and the ILD layer 130(n). The metal layer 166 includes a metal material that is suitable for the BEOL processes. For example, the metal layer 166 is one or more of Cu, Ru, W or Co. In an embodiment, the metal layer 166 at least partially overlaps with the source/drain structure 164. In an embodiment, the metal layer 166 fully overlaps with the semiconductor layer 152 and extends beyond the semiconductor layer 152 in a lateral direction. The additional surplus area of the metal layer 166 beyond the semiconductor layer 152 enables the metal layer 166 to be coupled to structures beyond the semiconductor layer 152, e.g., in a case that the source/drain structure 164 extends laterally beyond the semiconductor layer 152 or in a case that an interconnection to an upper level wirings is formed.

In an embodiment, the metal layer 166 is configured as a second gate electrode of the TFT transistor 160A. The MgO layer 158 is configured as a gate dielectric layer. That is, the metal layer 166 and the MgO layer 158 together form a second gate structure 168. The first gate structure 162 may be referred to as a front gate and the second gate structure 168 may be referred to as a back gate. Because the back gate structure 168 overlaps with the source/drain 164, portions 165 (shown with dotted lines) of the semiconductor layer 152 adjacent to the source/drain structures 164 become part of the source/drain regions. The source/drain regions 165 do not need to be doped to supply carriers to or from the source/drain structures 164 because of the direct gate control on the regions 165. As such, the portions 165 and the source/drain structures 164 together may be referred to source/drain regions as scenarios apply. A portion 167 of the semiconductor layer 152 is configured as a channel region.

On the other hand, the front gate structure 162 does not overlap the source/drain region 164, 165. To enable the carrier flow to or from the source/drain region 164, 165 the source/drain structures 164 are doped with suitable dopants of Ga, B, As or P depending on device configurations, e.g., p-type device or n-type device.

The front gate structure 162 may include similar structure or material combinations as a gate structure of a FEOL device, e.g., the gate structure 122 of the device 120. For example, the front gate structure 162 may include a metal gate electrode, a high-k gate dielectric layer and a spacer (not separately referred to for simplicity).

The front gate structure 162, the back gate structure 168 and the source/drain structures 164 are each coupled to respective wirings (not shown for simplicity) through respective interconnect structures 170.

The BEOL device 150, or specifically the semiconductor layer 152, may be adjacent to insulation structures 172, e.g., trench insulations. The insulation structures 172 may include a depth suitable for the specific structure configuration of the BEOL device 150. For example, in the scenario that the metal layer 166 is included in the BEOL device 150, the insulation structures 172 extend downward until reaching the ILD layer 130(n) on which the metal layer 166 is positioned. In other scenarios that the MgO layer 158 is formed over the ILD layer 130(n) without a metal layer 166 in-between or that the metal layer 166 is not patterned to form back gate structures, the insulation structures 172 may extend before or until reaching the MgO layer 158.

FIG. 1A shows one example embodiment of the BEOL device 150, which does not limit the scope of the disclosure. Other device configurations of the BEOL device 150 are also possible and included in the disclosure.

Figure 1B:
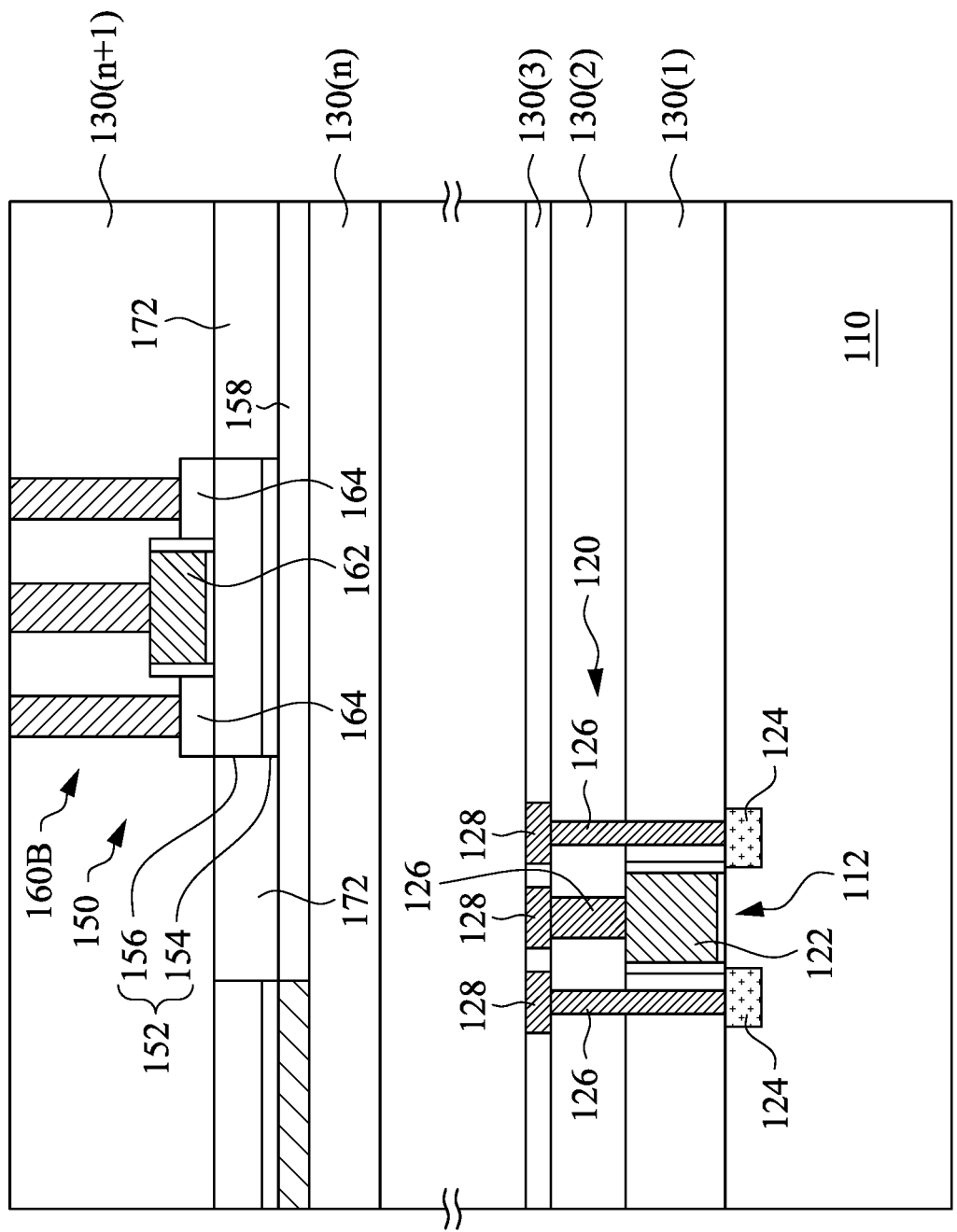

For example, FIG. 1B shows another embodiment of the structure 100 having a BEOL device 150. Referring to FIG. 1B, the BEOL device 150 include a transistor 160B that has only a front gate structure 162 adjacent to the semiconductor layer 152. FIG. 1B shows, as an illustrative example, that there is no metal layer 166 between the seed layer 158 of MgO and the underlying ILD layer 130(n). However, it is possible that a metal layer is formed between the seed layer 158 and the underlying ILD layer 130(n) to enhance the crystallinity of the MgO layer 158. The MgO 158 and the underlying metal layer, if any, are not patterned to be part of the transistor 160B. For example, the insulation structure 172 extends downward before or until reaching the MgO layer 158. FIG. 1B shows that insulation structure 172 extends to reach the MgO layer 158, as an illustrative example, which is not limiting. The rest of the FIG. 1B structure may be similar to that of FIG. 1A, the descriptions of which are omitted for simplicity purposes.

Figure 1C:
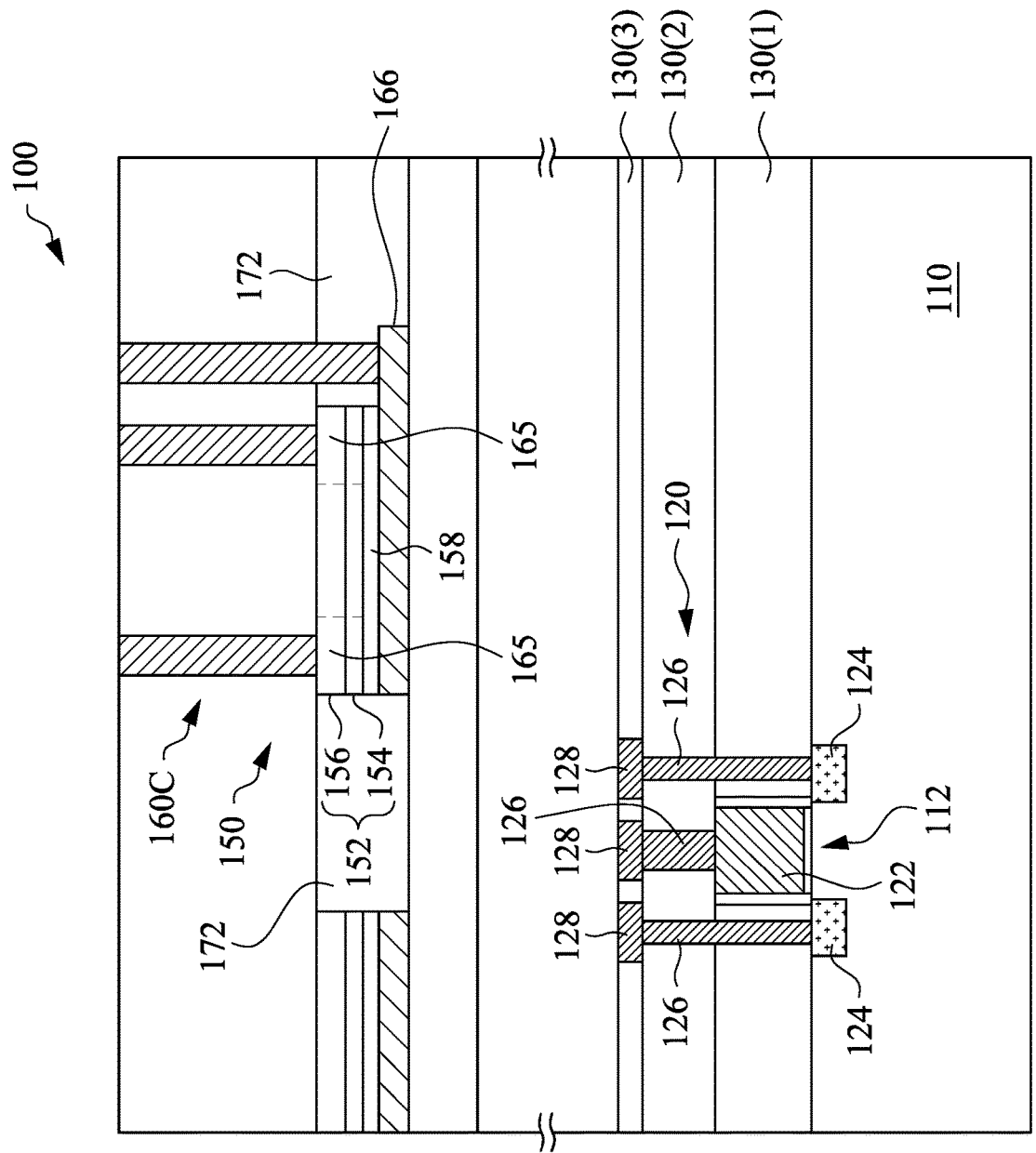

FIG. 1C shows a further embodiment of the structure 100 having a BEOL device 150. Referring to FIG. 1C, the BEOL device 150 includes a transistor 160C that has only back gate structure 168 adjacent to the semiconductor layer 152. Similar to FIG. 1A, the back gate structure 168 overlaps with the source/drain regions 165 of the semiconductor layer 152 and supplies carriers to or from the source/drain regions 165. The interconnect structures 170 may directly contact the source/drain regions 165, as shown in FIG. 1C, or may be coupled to the source/drain regions 165 through suitable source/drain electrodes or other heterojunction structure to enhance Ohmic contacts. The transistor 160C does not include a front gate structure. The rest of the FIG. 1C structure may be similar to that of FIG. 1A, the descriptions of which are omitted for simplicity purposes.

The specific features of the example BEOL devices 150 and example FEOL device 120 are provided for illustrative purposes and do not limit the scope of the disclosure. The disclosure also includes other BEOL devices that incorporate a crystalline semiconductor layer formed over a crystalline dielectric layer in the BEOL processes, e.g., over an amorphous ILD layer. The FEOL device 120 could be any devices formed under the FEOL processes, which are all included in the disclosure.

Further, the disclosure also includes a structure that includes only the BEOL device 150 and does not include a FEOL device 120. That is, in an embodiment, the substrate 110 includes an amorphous dielectric layer on the upper surface thereof and a device 150 is formed over the amorphous dielectric layer. For example, in an embodiment, a MgO seed layer 158 is formed on a glass substrate and a crystalline silicon layer 152 is formed over the MgO seed layer 158. Other variants are also possible and included in the disclosure.

Figure 2:
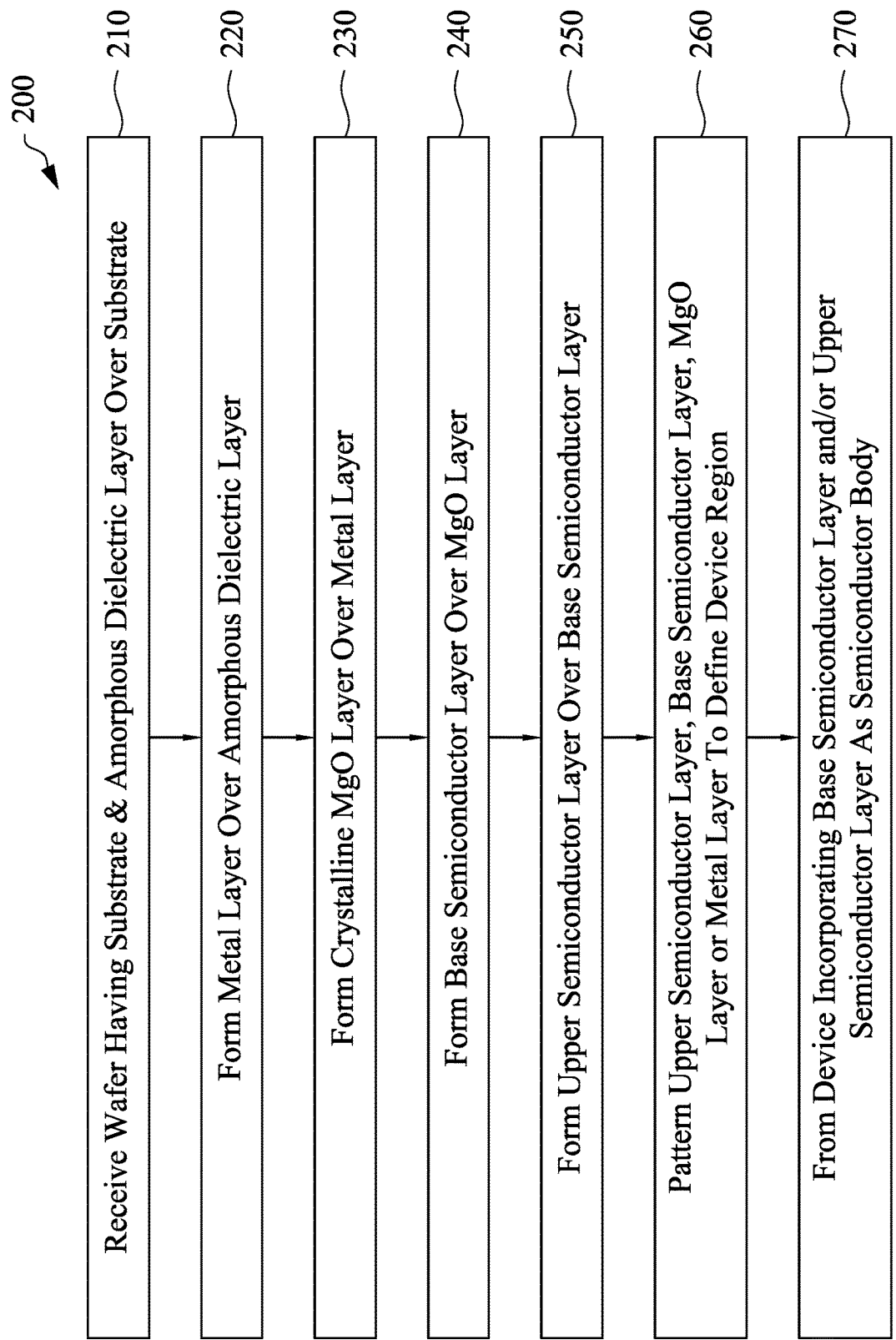
FIG. 2 is a flow diagram of an example process, according to example embodiments of the disclosure.

FIG. 2 is a flow diagram of an example process 200. FIGS. 3A-3G illustrate a wafer 300 in various fabrication stages under the process 200. Referring to FIG. 2, in example operation 210, with reference also to FIG. 3A, a wafer 300 is received. The wafer 300 includes a substrate 310 and an amorphous dielectric layer 320 over the substrate 310. The dielectric layer 320 is a low-k dielectric material or silicon oxide. The substrate 310 includes one or more of silicon substrate, other elemental semiconductor substrate, compound semiconductor substrate, silicon-on-insulator substrate or other types of substrate like dielectric substrate, glass substrate or metal substrate. The dielectric layer 320 may be one or more of part of the substrate 310, directly formed on the substrate 310, or separated from the substrate 310 by intermediate layers having structural features formed thereon. The structural features may be any layers formed between the substrate 310 and the dielectric layer 320, e.g., FEOL devices, metallization layers, or interconnect structures. In an embodiment, an interconnect via structure 322 is formed in the amorphous dielectric layer 320.

Figure 3A:
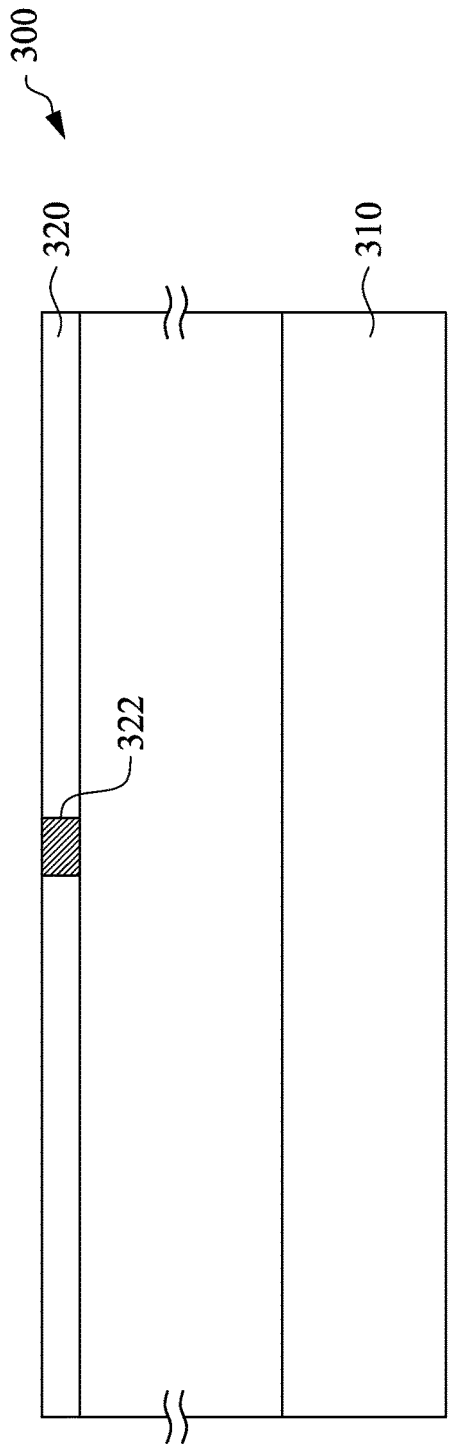
FIGS. 3A-3G are cross-sectional views of various stages of a wafer fabricated under the example process of FIG. 2, according to example embodiments of the disclosure.
Figure 3B:
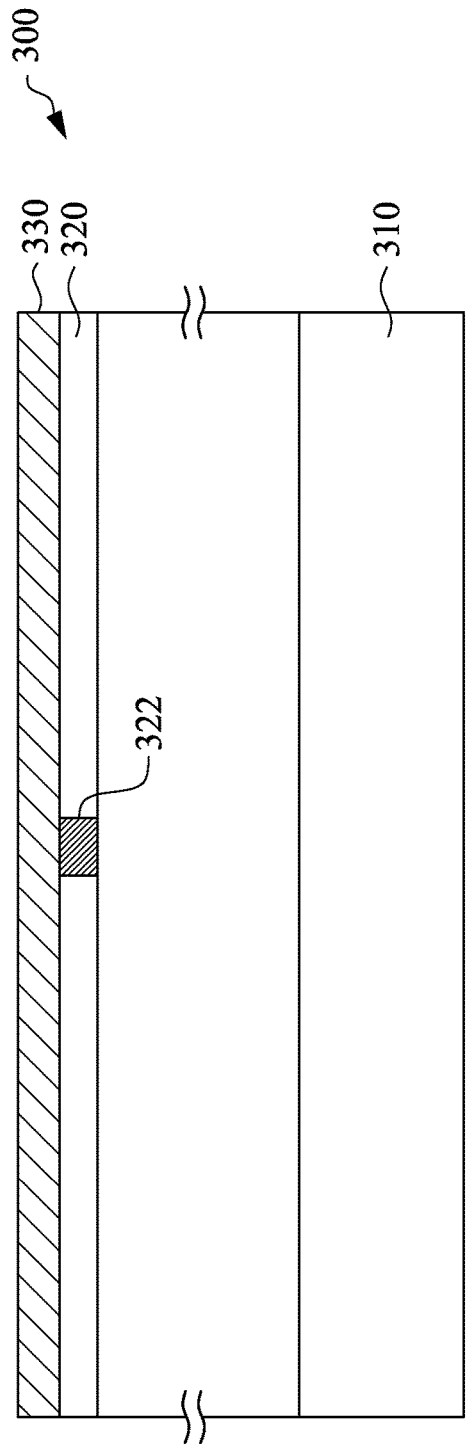

In example operation 220, with reference also to FIG. 3B, a metal layer 330 is formed over the dielectric layer 320. The metal layer 330 is one or more metal materials suitable or adopted for BEOL processes. For example the metal layer 330 is Cu, Ru, W, Co or other suitable metal materials like Al. The metal layer 330 is deposited using now known or future developed approaches, e.g., CVD, PVD, plating, or other suitable process. In an embodiment, the metal layer 330 is coupled to the interconnect structure 322.

Figure 3C:
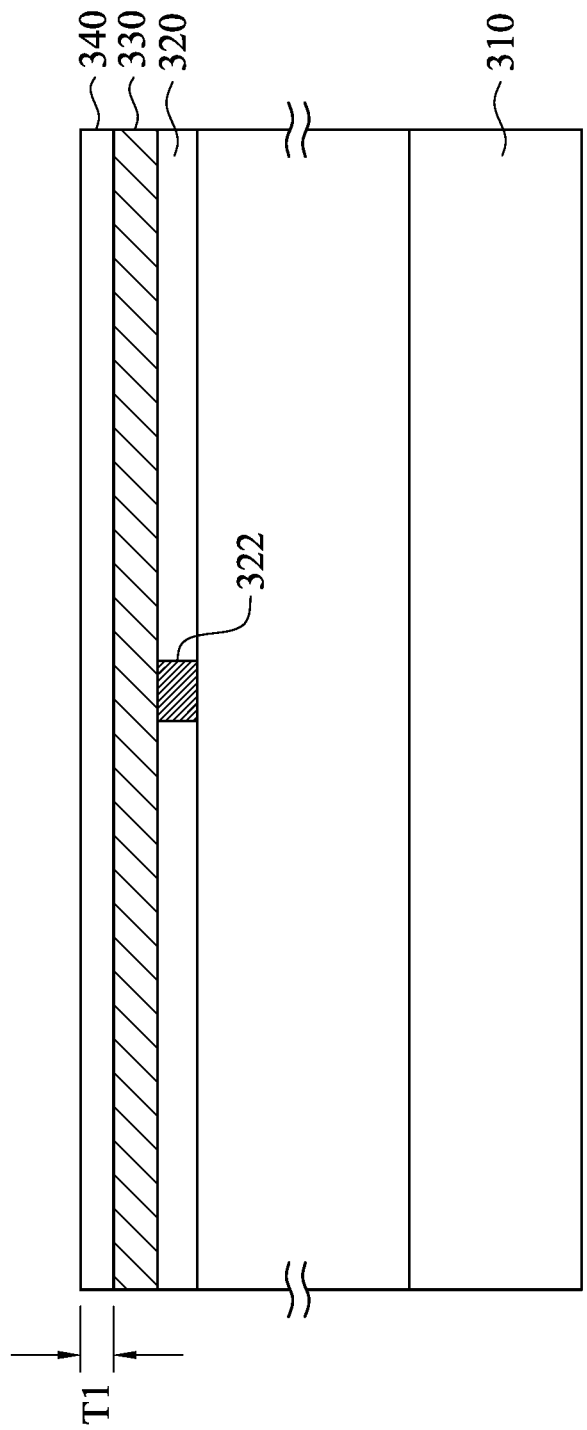

In example operation 230, with reference also to FIG. 3C, a seed layer 340 of MgO is formed over metal layer 330. In an embodiment, a thickness T1 of the MgO layer 340 is controlled to be as thin as 2 nm such that the MgO layer 340 may be suitably configured as a high-k gate dielectric layer. The MgO layer 340 may be formed through magnetic sputtering plus natural oxidization, ion beam assisted deposition (IBAD), energetic particle self-assist deposition (EPSAD) or other suitable deposition approaches.

The MgO layer 340 is crystalline, e.g., in the (001) facet crystal structure. The formation of the crystalline MgO may be a multi-step process. For example, the MgO may be deposited with a crystalline form on the surface of the metal layer 330 or with an amorphous form, or a mixture of both. A low temperature anneal process, e.g., with temperature between about 100° C. to about 400° C., is conducted to crystalize or enhance the crystallinity of the deposited MgO.

The metal layer 330 functions, among others, to improve the crystallinity of the MgO layer 340. However, the MgO layer 340 may also be formed in crystal structure directly over the dielectric layer 320 using suitable deposition approaches. For example, EPSAD and IBAD may be used to produce MgO with a thickness as low as 2 nm and with detectable crystallinity. As such, in an alternative or additional embodiment, the MgO layer 340 is formed directly over the amorphous dielectric layer 320 without an interlaying metal layer. In an embodiment, the MgO layer 340 may be annealed at a temperature about 350° C. for about 240 seconds to enhance the crystallinity.

Figure 3D:
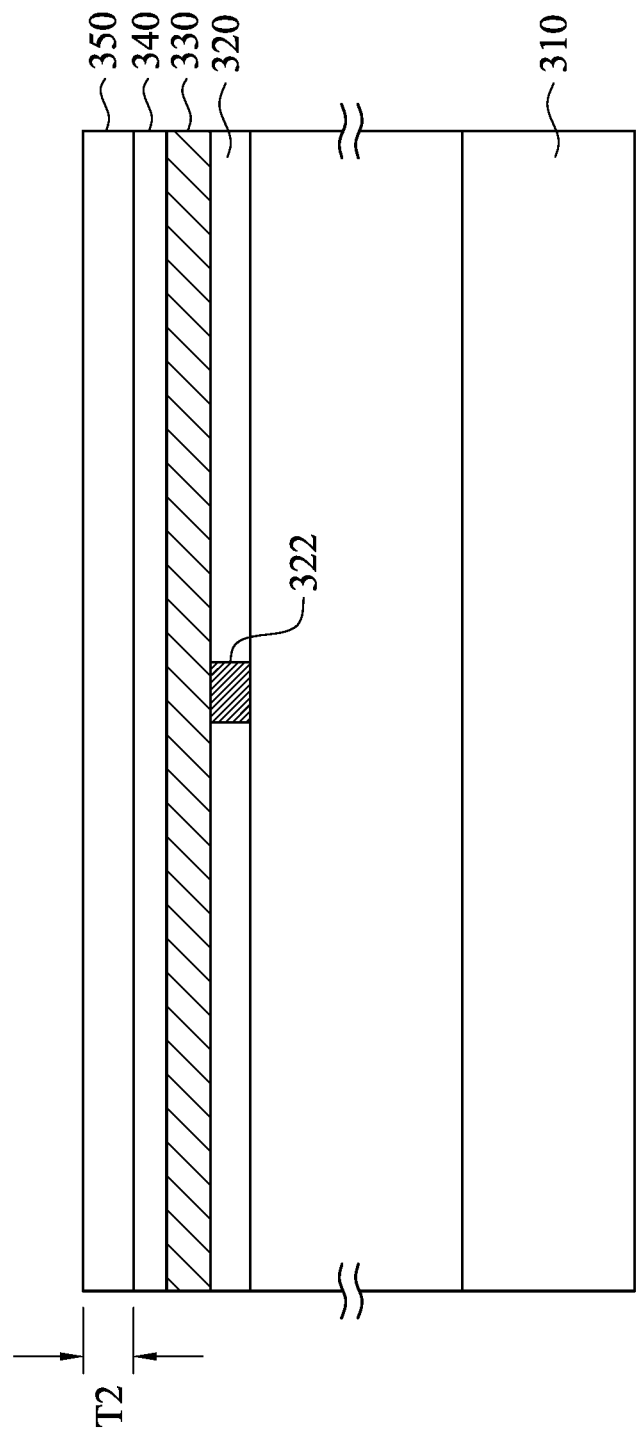

In example operation 240, with reference also to FIG. 3D, a base semiconductor layer 350 is formed over the MgO layer 340. The base semiconductor layer 350 is silicon, germanium, silicon germanium or other elemental or compound semiconductor materials. In other embodiments, the base semiconductor layer 350 is a compound semiconductor layer, e.g., an III-V compound like GaN, InN or GaAs. In the description herein, it is assumed that the base semiconductor layer 350 is silicon for descriptive purposes. For example, the base silicon layer 350 is also more readily compatible with the existing FEOL technology nodes, which are predominantly silicon based.

The base semiconductor layer 350 is crystalline. A multi-step process is conducted to form the crystalline structure of silicon. For example, the silicon material of the base semiconductor layer 350 is initially deposited over the MgO layer 340 using CVD or PVD or other suitable deposition approaches. The deposited silicon layer is amorphous. The amorphous silicon material is crystallized through annealing using nanosecond laser anneal techniques under a localized temperature of about 1000° C. or higher. The crystalline MgO layer 340 provides a physical lattice link for the formation of the crystalline silicon. To this extent, the MgO layer 340 is referred to as a seed layer, although the MgO layer 340 is configured to serve more functions than providing the lattice link of the crystalline structure.

In an embodiment, the base semiconductor layer 350 of silicon serves, among other, as a base for further deposition of semiconductor layers thereover. This base layer 350 of silicon enables more flexibility of material choices and/or process choices for the further deposition. For example, with the silicon base layer 350 formed, the wafer 300 is thus suitable for epitaxy processes to form further semiconductor layers thereover. Further, different crystalline semiconductor materials can be formed over the crystalline base silicon layer 350.

In an embodiment, a thickness T2 of the base silicon layer 350 is controlled to be within a range of between about 2 nm to about 5 nm. Other thickness is also possible and included in the disclosure, as long as the base silicon layer 350 maintains crystallinity.

Figure 3E:
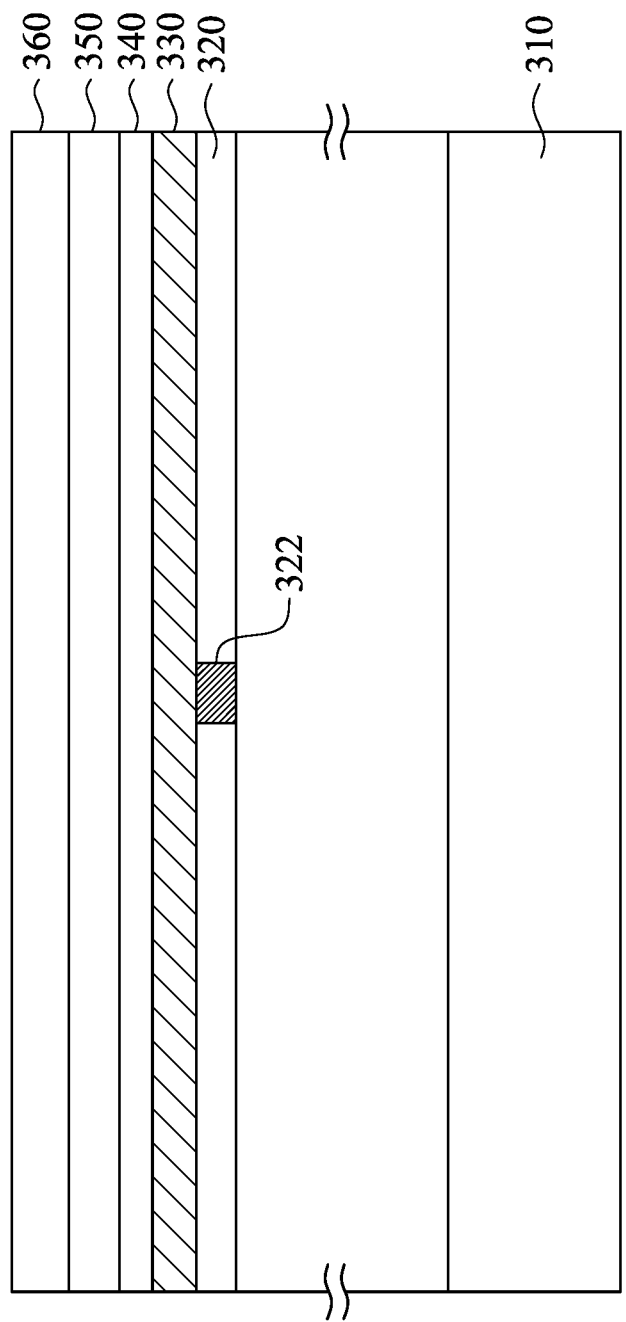

In example operation 250, with reference also to FIG. 3E, an upper semiconductor layer 360 is formed over the base semiconductor layer 350. The upper semiconductor layer 360 may include a same semiconductor material as the base semiconductor layer 350 or may include a different semiconductor material. The upper semiconductor layer 360 may be an elemental semiconductor material like silicon, germanium or other elemental semiconductor materials or may be a compound semiconductor material, e.g., silicon germanium or a III-V compound like GaN, InN or GaAs. In an embodiment, the upper semiconductor layer 360 includes a stack of semiconductor layers of two different semiconductor materials arranged in an alternating manner. For example, the upper semiconductor layer 360 may include silicon and silicon germanium layers vertically stacked in an alternating manner. In the disclosure herein, it is assumed that the upper semiconductor layer 360 is silicon for descriptive purposes.

In an embodiment, the upper semiconductor layer 360 is formed in an epitaxy process, while the base semiconductor layer 350 is not formed in epitaxy equipment.

The upper semiconductor layer 360 is crystalline silicon formed in a multi-step process. Silicon material is initially deposited over the silicon base layer 350 using e.g., MOCVD. The initially deposited silicon layer is amorphous. The amorphous silicon is crystalized through annealing using ns laser annealing processes. The laser annealing keeps the heating effect local such that the adjacent structures, e.g., the dielectric layer 320, will not be damaged by the annealing process. The base silicon layer 350 provides the crystalline lattice link for the crystallization of the upper silicon layer 360.

The upper silicon layer 360 may include a thickness ranging between about 2 nm to about 15 nm, depending on device/circuitry configurations.

Figure 3F:
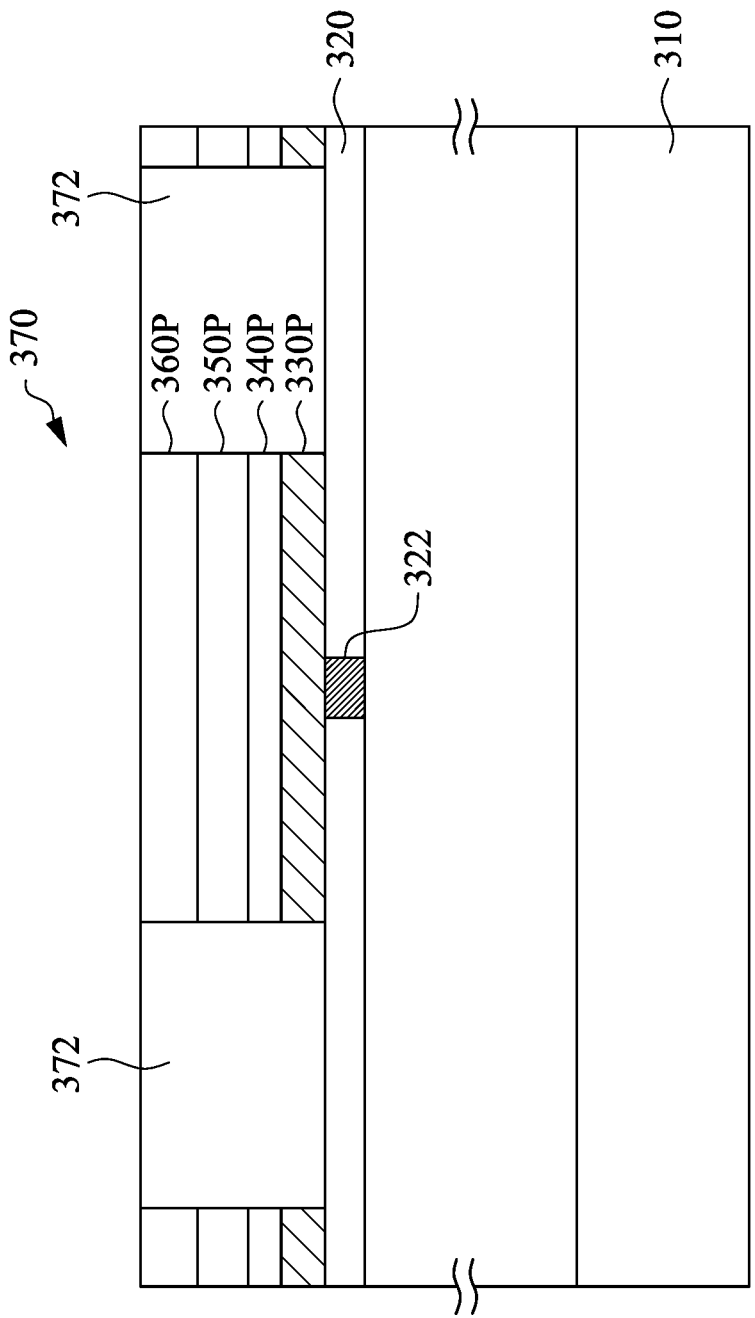

In example operation 260, with reference also to FIG. 3F, the layers 330, 340, 350, 360 are patterned, 330P, 340P, 350P, 360P, to define a device or active region 370. The patterning may be achieved through photolithography and etching or other suitable patterning techniques. FIG. 3F shows an illustrative example of the patterning, which does not limit the scope of the disclosure. In an embodiment, the patterned metal layer 330P remain in contact with the interconnect structure 322.

An insulation structure 372 is formed adjacent to the device region 370. In an embodiment, the insulation structure 372 extends downward until reaching the dielectric layer 320. Other configurations of the insulation structure 372 are also possible and included in the disclosure. The insulation structure 372 is low-k dielectric material or silicon oxide or other suitable dielectric materials. The insulating structure 372 may be formed as a separate step, or may be formed as part of the next ILD deposition. As such, after the complete processing, the entire TFT 160A is embedded in the next ILD layer.

Figure 3G:
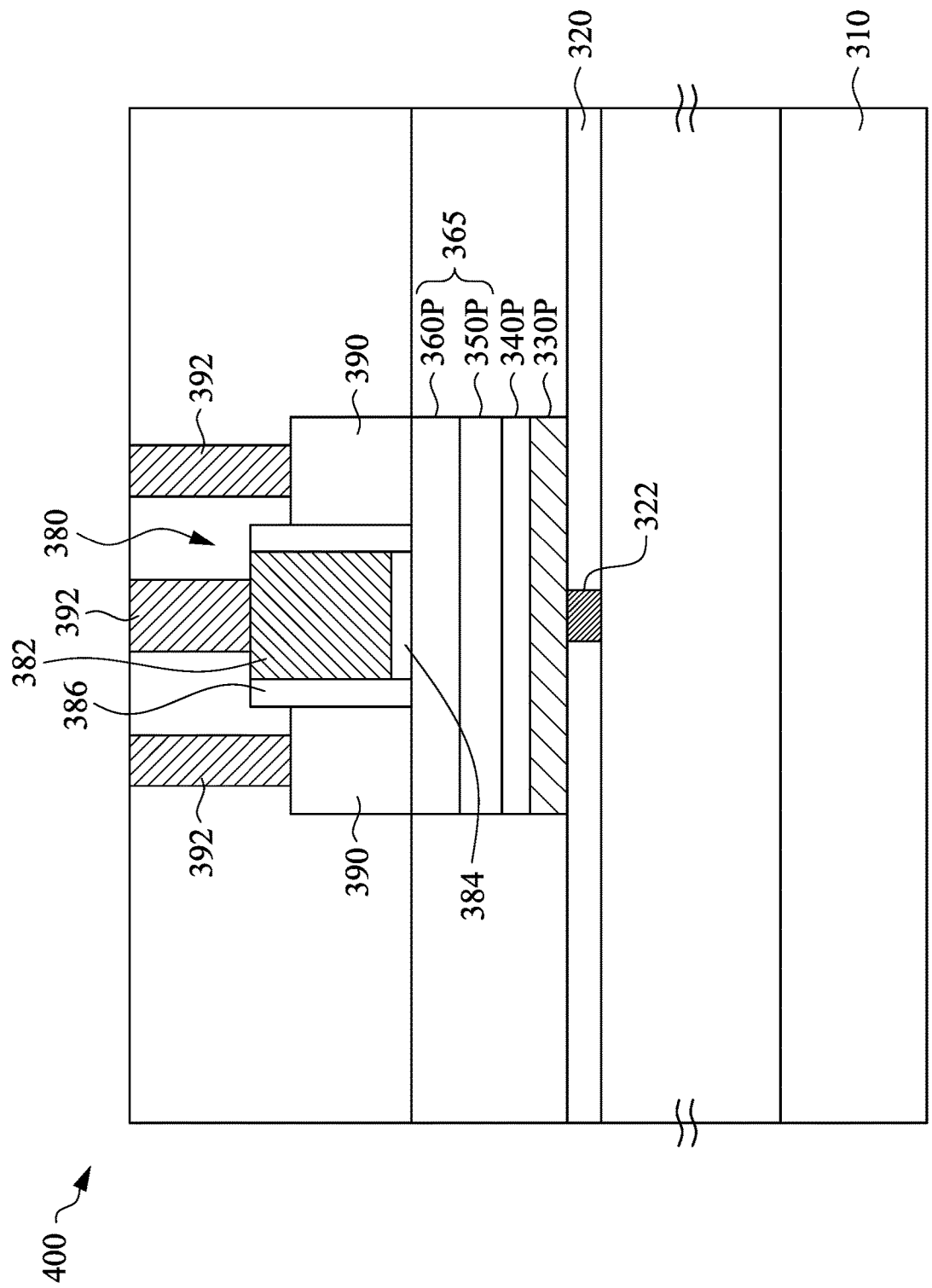

In example operation 270, with reference also to FIG. 3G, a device is formed incorporating the one or more of the base semiconductor layer 350P or the upper semiconductor layer 360P as a semiconductor body/layer 365. For example, a front gate structure 380 is formed adjacent to and at least partially over the semiconductor body 365. Source/drain structures 390 are formed adjacent to the semiconductor body 365 and positioned by two sides of the front gate structure 380. The front gate structure 380 may include a gate electrode 382, e.g., a metal gate electrode, a gate-dielectric 384, e.g., a high-k dielectric material, and a spacer 386.

The source/drain structures 390 include suitable semiconductor materials and are formed through epitaxy processes or other suitable approaches.

Interconnect structures 392 are formed connecting the source/drain structures 390 or the gate 380 to respective wirings.

The metal layer 330P may be configured as a back gate and the MgO layer 340P may be configured as a gate electric for the back gate 330P. The back gate 330P is connected through the interconnect structure 322 to the respective wirings. Note that the structural feature of FIG. 3G is a variant from that of FIG. 1A. This is an advantage of a BEOL device having more flexible access to metallization layers than a FEOL device.

The front gate structure 380, 162 may be formed in a replacement gate process. The following description lists examples of materials for the front gate structure 380, 162 including the gate electrode 382 and the gate dielectric 384, which are non-limiting. The gate electrode 382 includes a conductive material, e.g., a metal, a metal compound or a silicide. Suitable conductive materials for the gate electrode include TiN, W, Co, Ru, Cu, PtSi, CoSi, NiSi, and/or other metal, conductive metal oxides, metal nitrides or metal carbides like hafnium (Hf), zirconium (Zr), titanium (Ti), tantalum (Ta), aluminum (Al), aluminides hafnium carbide, zirconium carbide, titanium carbide, and aluminum carbide, and other suitable conductive materials.

In some examples, the gate electrode includes a work function adjustment layer tuned to have a proper work function for enhanced performance of the field effect transistor devices. For example, suitable N-type work function metals include Ta, TiAl, TiAlN, TaCN, other N-type work function metal, or a combination thereof, and suitable P-type work function metal materials include TiN, TaN, other P-type work function metal, or combination thereof. In some examples, a conductive layer, such as an aluminum layer, a copper layer, a cobalt layer or a tungsten layer is formed over the work function layer such that the gate electrode includes a work function layer disposed over the gate dielectric 384 and a conductive layer disposed over the work function layer and below a gate cap (not shown for simplicity). In an example, the gate electrode 382 has a thickness ranging from about 5 nm to about 40 nm depending on design requirements.

In example embodiments, the gate dielectric layer includes an interfacial silicon oxide layer (not separately shown for simplicity), e.g., thermal or chemical oxide having a thickness ranging from about 5 to about 10 angstrom (Å). In example embodiments, the gate dielectric layer further includes a high dielectric constant (high-K) dielectric material selected from one or more of hafnium oxide (HfO2), hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials. A high K dielectric material, in some applications, includes a dielectric constant (K) value larger than 6. Depending on design requirements, a dielectric material of a dielectric contact (K) value of 7 or higher is used. The high-K dielectric layer may be formed by atomic layer deposition (ALD) or other suitable technique. In accordance with embodiments described herein, the high-K dielectric layer of the gate dielectric layer includes a thickness ranging from about 10 to about 30 angstrom (Å) or other suitable thickness.

The spacer 386 is formed of a low K dielectric material such as silicon oxynitride (SiOxNy), $Si_3N_4$, SiO, $SiO_2$, SiONC, SiOC, vacuum and other dielectrics or other suitable materials. The outer spacer 386 may be formed through chemical vapor deposition (CVD), high density plasma CVD, spin-on, sputtering, or other suitable approaches.

In an embodiment, the material combination of the semiconductor layer 365, 152 and the source/drain structure 390, 164 are based on device/circuitry designs and configurations. For example, for a pMOS device, the semiconductor layer 365, 152 includes germanium Ge or silicon germanium SiGe and the source/drain structures 390, 164 include SiGe or SiGe:B. For a nMOS device, the semiconductor layer 365, 152 includes silicon (Si) and the source/drain structures 390, 164 include Si:P, SiC or SiC:P.

The substrate 310, 110 may include a silicon substrate in crystalline structure and/or other elementary semiconductors like germanium. Alternatively or additionally, the substrate 110 may include a compound semiconductor such as silicon carbide, gallium arsenide, indium arsenide, and/or indium phosphide. Further, the substrate 310, 110 may also include a silicon-on-insulator (SOI) structure. The substrate 310, 110 may include an epitaxial layer and/or may be strained for performance enhancement. The substrate 310, 110 may also include various doping configurations depending on design requirements such as P-type substrate and/or N-type substrate and various doped regions such as P-wells and/or N-wells.

The example structures are provided to facilitate a thorough understanding of the techniques and are not meant to be limiting. With the underlying MgO seed layer 340, 158, crystalline semiconductor layer 152, 365 are formed over amorphous dielectric layers 130, 320. The crystalline semiconductor layer enables various types of semiconductor devices to be formed in the BEOL processes, which are all included in the disclosure.

The present disclosure may be further appreciated with the description of the following embodiments.

In a structure embodiment, a structure includes a substrate, a first dielectric layer over the substrate, a crystalline second dielectric layer over the first dielectric layer; and a first crystalline semiconductor layer over the crystalline second dielectric layer.

In a device embodiment, a device includes a dielectric layer, a crystalline magnesium oxide layer over the dielectric layer, a crystalline semiconductor channel layer over the crystalline magnesium oxide layer, a gate structure at least partially overlapping the crystalline semiconductor layer, and a source/drain region adjacent to the crystalline semiconductor channel layer.

In a method embodiment, a wafer is received. The wafer includes a substrate and an amorphous dielectric layer over the substrate. A crystalline dielectric layer is formed over the amorphous dielectric layer. A crystalline semiconductor layer is formed over the crystalline dielectric layer.

What is claimed is:

1. A structure, comprising:
   a substrate;
   a first dielectric layer over the substrate;
   a crystalline second dielectric layer over the first dielectric layer; and
   a first crystalline semiconductor layer over the crystalline second dielectric layer.

2. The structure of claim 1, wherein the first dielectric layer is an inter-metal dielectric layer.

3. The structure of claim 1, further comprising a metal layer between the crystalline second dielectric layer and the first dielectric layer.

4. The structure of claim 3, wherein the metal layer is coupled to an interconnect structure within the first dielectric layer.

5. The structure of claim 1, wherein the crystalline second dielectric layer is magnesium oxide.

6. The structure of claim 1, further comprising a second crystalline semiconductor layer between the first crystalline semiconductor layer and the crystalline second dielectric layer.

7. The structure of claim 6, wherein the first crystalline semiconductor layer includes a different semiconductor material from that of the second crystalline semiconductor layer.

8. The structure of claim 1, wherein the first crystalline semiconductor layer is a silicon layer.

9. The structure of claim 1, further comprising a source/drain structure and a gate structure each positioned at least partially over the first crystalline semiconductor layer.

10. The structure of claim 1, further comprising an insulation structure laterally adjacent to the first crystalline semiconductor layer and over the first dielectric layer.

11. The structure of claim 1, further comprising a front-end-of-line semiconductor device positioned between the substrate and the first dielectric layer.

12. The structure of claim 1, wherein the first dielectric layer is amorphous.

13. A device, comprising:
a first dielectric layer;
a crystalline magnesium oxide layer over the first dielectric layer;
a crystalline semiconductor layer over the crystalline magnesium oxide layer;
a gate structure at least partially overlapping the crystalline semiconductor layer; and
a source or drain region contacting the crystalline semiconductor layer.

14. The device of claim 13, wherein the gate structure is positioned between the crystalline magnesium oxide layer and the first dielectric layer.

15. The device of claim 14, wherein the gate structure at least partially overlaps the source/drain region.

16. The device of claim 14, wherein the gate structure is coupled to an interconnect structure formed within the first dielectric layer.

17. The device of claim 13, wherein the gate structure is positioned at least partially over the crystalline semiconductor layer.

18. The device of claim 17, wherein the source/drain region includes a source/drain structure that is positioned at least partially over the crystalline semiconductor layer.

19. A method, comprising:
receiving a wafer, the wafer having a substrate and an amorphous dielectric layer over the substrate;
forming a crystalline dielectric layer over the amorphous dielectric layer;
depositing a layer of amorphous semiconductor material over the crystalline dielectric layer; and
crystalizing the amorphous semiconductor material through nanosecond laser annealing.

20. The method of claim 19, further comprising:
forming a metal layer over the amorphous dielectric layer; and
wherein the crystalline dielectric layer is formed over the metal layer.

* * * * *